(12) United States Patent
Xu et al.

(10) Patent No.: US 10,361,200 B1
(45) Date of Patent: Jul. 23, 2019

(54) VERTICAL FIN FIELD EFFECT TRANSISTOR WITH INTEGRAL U-SHAPED ELECTRICAL GATE CONNECTION

(71) Applicant: INTERNATIONAL BUSINESS MACHINES CORPORATION, Armonk, NY (US)

(72) Inventors: Wenyu Xu, Albany, NY (US); Chen Zhang, Albany, NY (US); Xin Miao, Guilderland, NY (US); Kangguo Cheng, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/914,375

(22) Filed: Mar. 7, 2018

(51) Int. Cl.
| | | |
|---|---|---|
| *H01L 21/28* | (2006.01) | |
| *H01L 29/10* | (2006.01) | |
| *H01L 29/49* | (2006.01) | |
| *H01L 29/66* | (2006.01) | |
| *H01L 29/78* | (2006.01) | |
| *H01L 27/092* | (2006.01) | |
| *H01L 29/423* | (2006.01) | |
| *H01L 21/8238* | (2006.01) | |
| *H01L 21/311* | (2006.01) | |

(Continued)

(52) U.S. Cl.
CPC ...... *H01L 27/092* (2013.01); *H01L 21/28079* (2013.01); *H01L 21/28088* (2013.01); *H01L 21/823842* (2013.01); *H01L 21/823857* (2013.01); *H01L 21/823871* (2013.01); *H01L 21/823885* (2013.01); *H01L 29/1037* (2013.01); *H01L 29/42376* (2013.01); *H01L 29/4958* (2013.01); *H01L 29/4966* (2013.01); *H01L 29/6656* (2013.01); *H01L 29/7827* (2013.01); *H01L 21/31053* (2013.01); *H01L 21/31116* (2013.01); *H01L 21/32136* (2013.01)

(58) Field of Classification Search
CPC ............. H01L 27/092; H01L 21/29079; H01L 21/28088; H01L 21/823857
See application file for complete search history.

(56) References Cited

U.S. PATENT DOCUMENTS

| | | |
|---|---|---|
| 4,252,579 A | 2/1981 | Ho et al. |
| 4,462,040 A | 7/1984 | Ho et al. |

(Continued)

FOREIGN PATENT DOCUMENTS

CN 103871856 B 8/2016

*Primary Examiner* — Zandra V Smith
*Assistant Examiner* — Andre C Stevenson
(74) *Attorney, Agent, or Firm* — Tutunjian & Bitetto, P.C.; Vazken Alexanian

(57) ABSTRACT

A method of forming a complementary metal-oxide-semiconductor (CMOS) device is provided. The method includes forming a bottom spacer layer on a substrate around two adjacent vertical fins, and forming a first work function layer on both of the two adjacent vertical fins. The method further includes removing a portion of the first work function layer from one of the two adjacent vertical fins, and forming a second work function layer on the remaining portion of the first work function layer and on the one of the two adjacent vertical fins, wherein the second work function layer forms part of a gate structure on the one of the two adjacent vertical fins and an electrical connection to the first work function layer on the other of the two adjacent vertical fins.

20 Claims, 12 Drawing Sheets

(51) Int. Cl.
  *H01L 21/3105* (2006.01)
  *H01L 21/3213* (2006.01)

(56) References Cited

U.S. PATENT DOCUMENTS

| | | |
|---|---|---|
| 7,683,428 B2 | 3/2010 | Chidambarrao et al. |
| 9,202,691 B2 | 12/2015 | Huang et al. |
| 9,406,670 B1 | 8/2016 | Or-Bach et al. |
| 9,685,531 B2 | 6/2017 | Lu et al. |
| 9,780,208 B1 | 10/2017 | Xie et al. |
| 10,002,791 B1 * | 6/2018 | Bao .................. H01L 21/82345 |
| 2008/0079065 A1 | 4/2008 | Zhang et al. |
| 2017/0222005 A1 | 8/2017 | Lin et al. |
| 2017/0345912 A1 | 11/2017 | Kim |
| 2018/0080497 A1 * | 3/2018 | Fukazu .................. C08L 79/08 |

\* cited by examiner

VERTICAL FIN FIELD EFFECT TRANSISTOR WITH INTEGRAL U-SHAPED ELECTRICAL GATE CONNECTION

BACKGROUND

Technical Field

The present invention generally relates to forming a vertical fin field effect transistor (FinFET) with an integral U-shaped electrical gate connection, and more particularly to a fabrication process for electrically coupling the gates of an n-type FinFET and a p-type FinFET to form a complementary metal-oxide-semiconductor (CMOS) device having less restrictive patterning tolerances.

Description of the Related Art

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a MOSFET with a single gate parallel with the plane of the substrate. Depending on the doping of the source and drain, an n-FET or a p-FET can be formed.

Examples of FETs can include a metal-oxide-semiconductor field effect transistor (MOSFET) and an insulated-gate field-effect transistor (IGFET). Two FETs also can be coupled to form a complementary metal oxide semiconductor (CMOS) device, where a p-channel MOSFET and n-channel MOSFET are coupled together.

With ever decreasing device dimensions, forming the individual components and electrical contacts becomes more difficult. An approach is therefore needed that retains the positive aspects of traditional FET structures, while overcoming the scaling issues created by forming smaller device components.

SUMMARY

In accordance with an embodiment of the present invention, a method of forming a complementary metal-oxide-semiconductor (CMOS) device is provided. The method includes forming a bottom spacer layer on a substrate around two adjacent vertical fins, and forming a first work function layer on both of the two adjacent vertical fins. The method further includes removing a portion of the first work function layer from one of the two adjacent vertical fins, and forming a second work function layer on the remaining portion of the first work function layer and on the one of the two adjacent vertical fins, wherein the second work function layer forms part of a gate structure on the one of the two adjacent vertical fins and an electrical connection to the first work function layer on the other of the two adjacent vertical fins.

In accordance with another embodiment of the present invention, a method of forming a complementary metal-oxide-semiconductor (CMOS) device is provided. The method includes forming a bottom spacer layer on a substrate around two adjacent vertical fins. The method further includes forming a first work function layer on both of the two adjacent vertical fins. The method further includes removing a portion of the first work function layer from one of the two adjacent vertical fins. The method further includes forming a second work function layer on the remaining portion of the first work function layer and on the one of the two adjacent vertical fins, wherein the second work function layer forms part of a gate structure on the one of the two adjacent vertical fins, and removing the second work function layer from the remaining portion of the first work function layer.

In accordance with yet another embodiment of the present invention, a complementary metal-oxide-semiconductor (CMOS) device is provided. The CMOS device includes a bottom spacer layer on a substrate around two adjacent vertical fins. The CMOS device further includes a first work function layer on one of the two adjacent vertical fins, and a second work function layer on the first work function layer and the other of the two adjacent vertical fins, wherein the second work function layer forms part of a gate structure on the other of the two adjacent vertical fins and an electrical connection to the first work function layer.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention relate generally to utilizing self-aligned layers to form adjacent gate structures with electrical connections without the use of strict N-P masking block variation tolerances to control the placement of overlapping conductive layers. The use of overlapping conductive layers can avoid the narrow location tolerance for positioning masking blocks when forming the boundary between n-type and p-type work function layers on adjacent FinFETs.

Embodiments of the present invention also relate generally to forming an n-type work function layer over a p-type work function layer on a vertical fin, and using the interface between the n-type work function layer and p-type work function layer to form the electrical gate connection for electrically coupling the gates of an n-type FinFET and a p-type FinFET to form a complementary metal-oxide-semiconductor (CMOS) device. A second work function layer can form a U-shaped electrical connection between adjacent gate structures. The larger interfacial area between an overlapping n-type work function layer and p-type work function layer can also reduce electrical resistance between the gate structures.

Embodiments of the present invention also relate generally to forming a single conductive gate layer on the n-type work function layer and p-type work function layer on separate vertical fins to form the electrical gate connection of a CMOS device. A portion of the conductive gate layer can form a U-shaped electrical connection between adjacent gate structures.

Embodiments of the present invention also relate generally to reducing the stripping of work function material layers forming gate structures to avoid overlay errors in placing masking blocks, while maintaining a maximum amount of overlap between conductive layers of the adjacent gate structures. Looser tolerances can be utilized in masking and etching work function layers when overlay errors for lithographic patterning do not affect the self-aligned placement of the work function layers.

A gate pattern layer can plug the gap between two adjacent vertical fins and mask the work function layers to preserve the U-shaped electrical connection, while portions of the other conductive layers of the gate structures can be trimmed. The work function layers can be limited to the sidewalls and endwalls of the vertical fins forming the FinFETs.

Exemplary applications/uses to which the present invention can be applied include, but are not limited to: logic and memory devices including by not limited to Flip-Flops, NAND and NOR gates, and dynamic random access memory (DRAM).

It is to be understood that aspects of the present invention will be described in terms of a given illustrative architecture;

however, other architectures, structures, substrate materials and process features and steps can be varied within the scope of aspects of the present invention.

Figure 1:
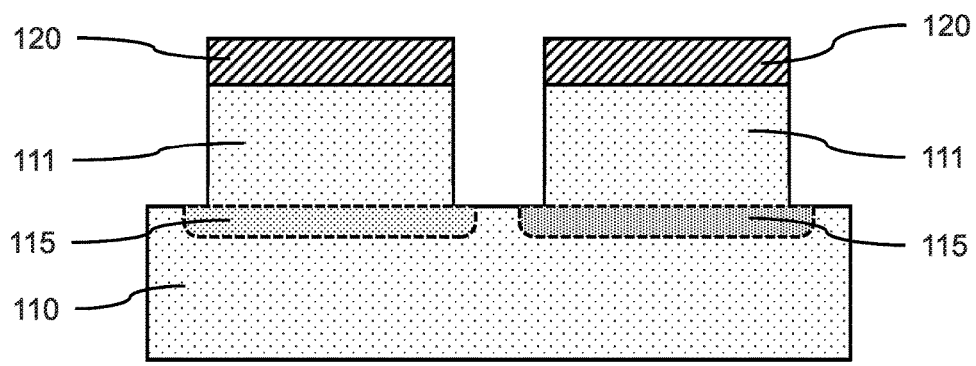
FIG. 1 is a cross-sectional side view showing the long axis of two adjacent vertical fins with fin templates on a doped substrate, in accordance with an embodiment of the present invention.

Referring now to the drawings in which like numerals represent the same or similar elements and initially to FIG. 1, a cross-sectional side view of the long axis of two adjacent vertical fins with fin templates on a doped substrate is shown, in accordance with an embodiment of the present invention.

In one or more embodiments, a substrate 110 can be, for example, a single crystal semiconductor material wafer or a semiconductor-on-insulator stacked wafer. The substrate can include a support layer that provides structural support, and an active semiconductor layer that can form devices. An insulating layer (e.g., a buried oxide (BOX) layer) may be between the active semiconductor layer and the support layer to form a semiconductor-on-insulator substrate (SeOI) (e.g., a silicon-on-insulator substrate (SOI)), or an implanted layer can form a buried insulating material.

The support layer can include crystalline, semi-crystalline, micro-crystalline, nano-crystalline, and/or amorphous phases. The support layer can be a semiconductor (e.g., silicon (Si), silicon carbide (SiC), silicon-germanium (SiGe), germanium (Ge), gallium-arsenide (GaAs), cadmium-telluride (CdTe), etc.), an insulator (e.g.: glass (e.g. silica, borosilicate glass), ceramic (e.g., aluminum oxide ($Al_2O_3$), sapphire), plastic (e.g., polycarbonate, polyacetonitrile), metal (e.g. aluminum, gold, titanium, molybdenum-copper (MoCu) composites, etc.), or combination thereof.

The active semiconductor layer can be a crystalline semiconductor, for example, a IV or IV-IV semiconductor (e.g., silicon (Si), silicon carbide (SiC), silicon-germanium (SiGe), germanium (Ge)), a III-V semiconductor (e.g., gallium-arsenide (GaAs), indium-phosphide (InP), indium-antimonide (InSb)), a II-VI semiconductor (e.g., cadmium-telluride (CdTe), zinc-telluride (ZnTe), zinc sulfide (ZnS), zinc selenide (ZnSe)), or a IV-VI semiconductor (e.g., tin sulfide (SnS), lead selenide (PbSb)).

A plurality of vertical fins 111 can be formed on the substrate 110 with a fin template 120 on each of the vertical fins, in accordance with an embodiment of the present invention.

In one or more embodiments, a plurality of vertical fins 111 can be formed on the substrate 110, where the vertical fins can be formed by a multiple patterning fabrication process, for example, a sidewall image transfer (SIT) process, a self-aligned double patterning (SADP) process, self-aligned triple patterning (SATP) process, or a self-aligned quadruple patterning (SAQP). The vertical fins may be formed by a direct write process or double patterning process using, for example, immersion lithography, extreme ultraviolet lithography, or x-ray lithography followed by etching.

In various embodiments, the vertical fins can have a height in the range of about 15 nanometers (nm) to about 100 nm, or about 15 nm to about 50 nm, or about 50 nm to about 100 nm, or about 30 nm to about 70 nm, although other heights are contemplated.

In various embodiments, the adjacent vertical fins 111 can be separated by a distance in a range of about 20 nm to about 70 nm, or about 20 nm to about 50 nm, or about 30 nm to about 40 nm, although other distances are also contemplated.

In various embodiments, a fin template 120 may be on each vertical fin 111, where the fin template 120 is formed during the patterning process. The fin templates 120 can be a hard mask, for example, silicon oxide (SiO), silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof. A thin (i.e., <1 nm) oxide layer can be between the top surface of the vertical fin 111 and the fin template 120.

In various embodiments, a bottom source/drain region 115 can be formed below the vertical fins 111 by dopant implantation, for example, ion implantation, to form a vertical transport fin field effect transistor (VT FinFET). One of the VT FinFETs can be doped to form an n-type FinFET, and the other of the two FinFETs can be doped to form a p-type FinFET, where the integral U-shaped electrical gate connection can electrically couple the gate structure of the n-type FinFET to the gate structure of the p-type FinFET.

Figure 2:
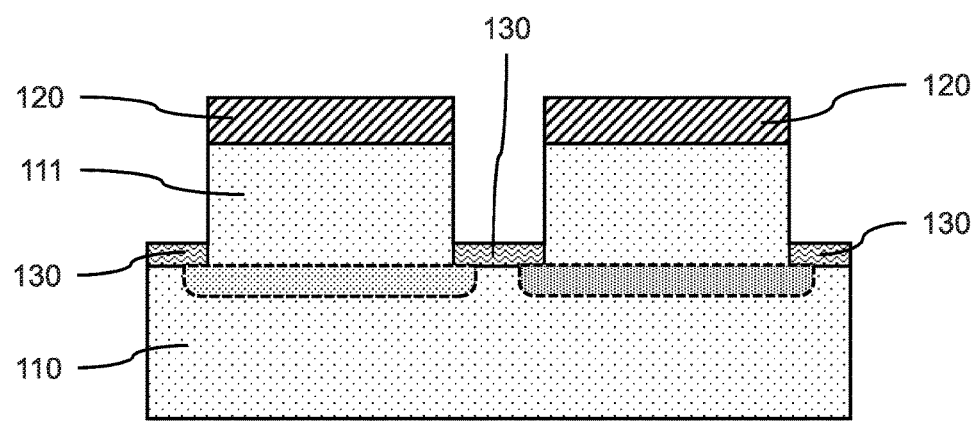
FIG. 2 is a cross-sectional side view showing the long axis of two adjacent vertical fins with a bottom spacer layer on the substrate around the vertical fins, in accordance with an embodiment of the present invention.

FIG. 2 is a cross-sectional side view showing the long axis of two adjacent vertical fins with a bottom spacer layer on the substrate around the vertical fins, in accordance with an embodiment of the present invention.

In one or more embodiments, a bottom spacer layer 130 can be formed on the surface of the substrate 110, as well as on a lower portion of the vertical fins 111, where the bottom spacer layer can be formed between and around adjacent vertical fins 111.

In various embodiments, the bottom spacer layer 130 can be formed by a directional deposition, for example, a high density plasma CVD (HDPCVD), physical vapor deposition (PVD), or gas cluster ion beam (GCIB), or a blanket deposition and etch-back. In embodiments that use PVD, a sputtering apparatus may include direct-current diode systems, radio frequency sputtering, magnetron sputtering, or ionized metal plasma sputtering. In embodiments that use GCIB deposition, a high-pressure gas is allowed to expand in a vacuum, subsequently condensing into clusters. The clusters can be ionized and directed onto a surface, providing a highly anisotropic deposition.

In various embodiments, the material of the bottom spacer layer 130 can be a dielectric material including, but not be limited to, silicon oxide (SiO), silicon nitride (SiN), a silicon oxynitride (SiON), a silicon carbonitride (SiCN), a silicon boronitride (SiBN), a silicon borocarbide (SiBC), a low-K dielectric, or combinations thereof. A low-K dielectric can include amorphous carbon (a-C), fluorine doped silicon oxide (SiO:F), carbon doped silicon oxide (SiO:C), SiCOH, silicon boro carbonitride (SiBCN), or a combination thereof. Other examples include, Applied Material's Black Diamond™.

In various embodiments, the bottom spacer layer 130 can have a thickness in the range of about 3 nm to about 15 nm, or in the range of about 5 nm to about 10 nm, or about 3 nm to about 5 nm, although other thicknesses are contemplated.

Figure 3:
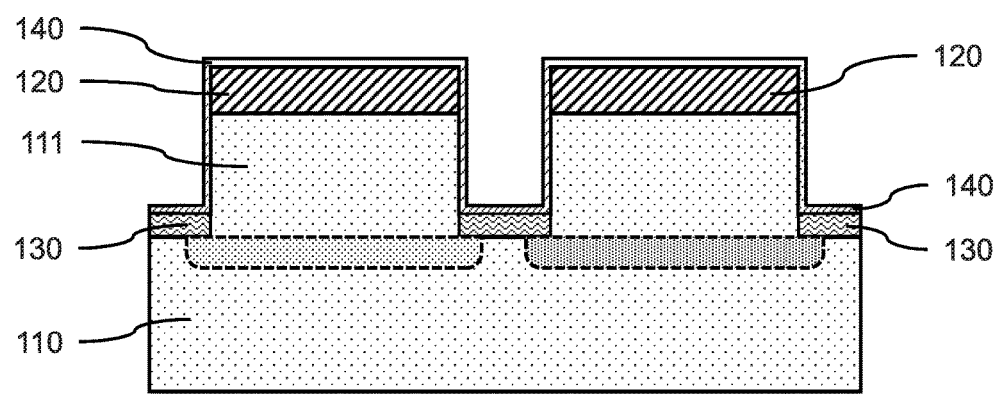
FIG. 3 is a cross-sectional side view showing the long axis of two adjacent vertical fins with a gate dielectric layer on each of the vertical fins and the bottom spacer layer, in accordance with an embodiment of the present invention.

FIG. 3 is a cross-sectional side view showing the long axis of two adjacent vertical fins with a gate dielectric layer on each of the vertical fins and the bottom spacer layer, in accordance with an embodiment of the present invention.

In one or more embodiments, a gate dielectric layer 140 can be formed on the exposed portions of the vertical fins 111 and the fin templates 120, where the gate dielectric layer 140 can cover the sidewalls and endwalls of each vertical fin. The gate dielectric layer 140 can be formed by a conformal deposition (e.g., atomic layer deposition (ALD), plasma enhanced ALD (PEALD)).

In one or more embodiments, a gate dielectric layer 140 can be dielectric material including, but not limited to, silicon oxide (SiO), silicon nitride (SiN), silicon oxynitride (SiON), boron nitride (BN), high-k dielectric materials, and a combination thereof. Examples of high-k materials include but are not limited to metal oxides, such as, hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), and lead zinc niobate (PbZn-NbO). The high-k material may further include dopants such as lanthanum, aluminum, magnesium, or combinations thereof.

In various embodiments, the gate dielectric layer 140 can have a thickness in the range of about 7 Å to about 50 Å, or about 7 Å to about 30 Å, or about 1 nm to about 2 nm, although other thicknesses are contemplated.

Figure 4:
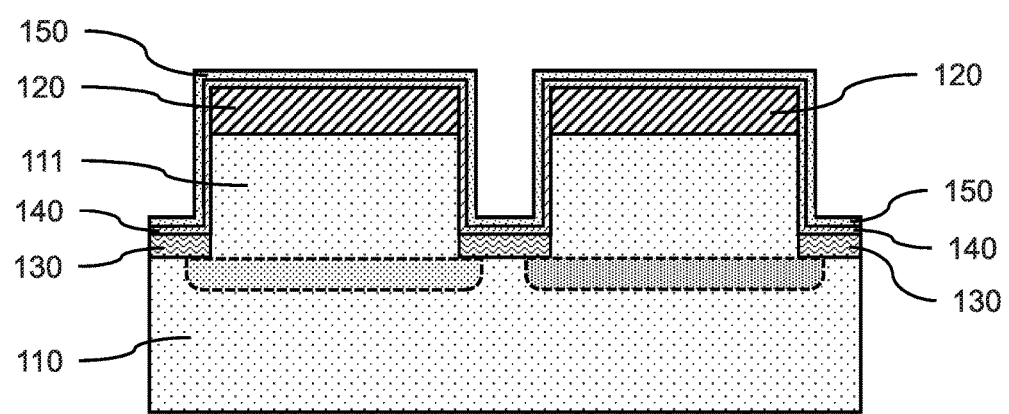
FIG. 4 is a cross-sectional side view showing the long axis of two adjacent vertical fins with a first work function layer on the gate dielectric layer, in accordance with an embodiment of the present invention.

FIG. 4 is a cross-sectional side view showing the long axis of two adjacent vertical fins with a first work function layer on the gate dielectric layer, in accordance with an embodiment of the present invention.

In one or more embodiments, a work function material (WFM) can form a first work function layer 150 on at least a portion of the gate dielectric layer 140 on the vertical fins 111, where the first work function layer 150 and gate dielectric layer 140 can form a gate structure for a fin field effect transistor (FinFET). The first work function layer 150 can be deposited on the gate dielectric layer 140 by a conformal deposition (e.g., ALD, PEALD). In various embodiments, the current can flow vertically from a bottom source/drain region 115 in the substrate through a channel region formed by the vertical fin 111 and the gate structure to a top source/drain on the vertical fin.

In various embodiments, the first work function layer 150 can include, but not necessarily be limited to, titanium nitride (TiN), tantalum nitride (TaN) or ruthenium (Ru), for a PFET. The first work function layer 150 can include, but not necessarily be limited to, titanium nitride (TiN), titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN or lanthanum (La) doped tantalum nitride (TaN), for an NFET.

The first work function layer 150 can have a thickness in the range of about 2 nm to about 20 nm, or about 2 nm to about 15 nm, or about 5 nm to about 15 nm, or about 5 nm to about 10 nm, although other thicknesses are contemplated.

Figure 5:
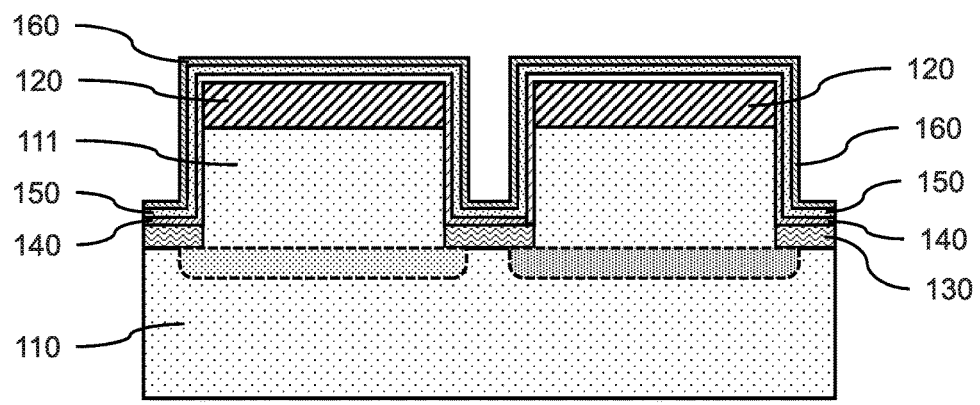
FIG. 5 is a cross-sectional side view showing the long axis of two adjacent vertical fins with a first protective liner on the first work function layer, in accordance with an embodiment of the present invention.

FIG. 5 is a cross-sectional side view showing the long axis of two adjacent vertical fins with a first protective liner on the first work function layer, in accordance with an embodiment of the present invention.

In one or more embodiments, a first protective liner 160 can be formed on the first work function layer 150 over the vertical fins 111 and the fin templates 120, where the first protective liner 160 can cover the first work function layer 150 on the sidewalls and endwalls of each vertical fin. The first protective liner 160 can be formed by a conformal deposition (e.g., atomic layer deposition (ALD), plasma enhanced ALD (PEALD)).

In one or more embodiments, the first protective liner 160 can be dielectric material including, but not limited to, silicon nitride (SiN), silicon oxide (SiO), a silicon oxynitride (SiON), a silicon carbide (SiC), a silicon oxygen carbonitride (SiOCN), or a silicoboron carbonitride (SiBCN), high-k dielectric materials, and a combination thereof.

In various embodiments, the first protective liner 160 can have a thickness in the range of about 1 nm to about 6 nm, or about 2 nm to about 5 nm, although other thicknesses are contemplated. The first protective liner 160 can act as an etch stop layer for removing portions of the first work function layer 150, where the first protective liner 160 can be a material different from the fin templates 120 and bottom spacer layer 130.

Figure 6:
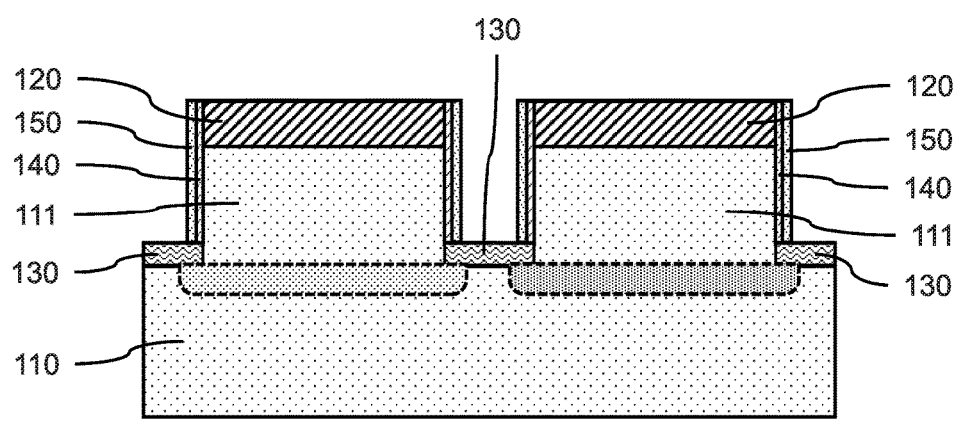
FIG. 6 is a cross-sectional side view showing the long axis of two adjacent vertical fins after removing the protective liner and a portion of the work function layer and gate dielectric layer from the horizontal surfaces, in accordance with an embodiment of the present invention.

FIG. 6 is a cross-sectional side view showing the long axis of two adjacent vertical fins after removing the protective liner and a portion of the work function layer and gate dielectric layer from the horizontal surfaces, in accordance with an embodiment of the present invention.

In one or more embodiments, an anisotropic etch, for example, one or more directional reactive ion etches (RIEs) can be used to remove portions of the first protective liner 160, first work function layer 150, and gate dielectric layer 140 on exposed horizontal surfaces of the substrate 110 and fin templates 120. Removal of the first protective liner 160, first work function layer 150, and gate dielectric layer 140 can expose portions of the bottom spacer layer 130 between adjacent vertical fins 111. The use of a directional, anisotropic etch (e.g., RIE) can provide a self-aligned etch, where the first work function layer 150 can be removed from the surfaces approximately perpendicular to the ion etch direction, while remaining on the vertical surfaces parallel with the ion etch direction. Removal of the first work function layer 150 from the bottom spacer layer 130 between the two adjacent vertical fins 111 can avoid the strict boundary patterning requirements for placement of subsequent masking blocks, where misplacement of a masking block and subsequent etching can form an open circuit between the gate structures on two adjacent vertical fins.

In various embodiments, the first protective liner 160 can be removed from the first work function layer 150 on the sidewalls and endwalls of the vertical fins 111 using a selective isotropic etch, for example, a wet chemical etch or dry plasma etch. Removal of the first protective liner 160 can expose the remaining portions of the first work function layer 150. Portions of the first work function layer 150 can remain on the sidewalls and endwalls of the vertical fins 111 with the gate dielectric layer 140 between the remaining portions of the first work function layer and vertical fins.

Figure 7:
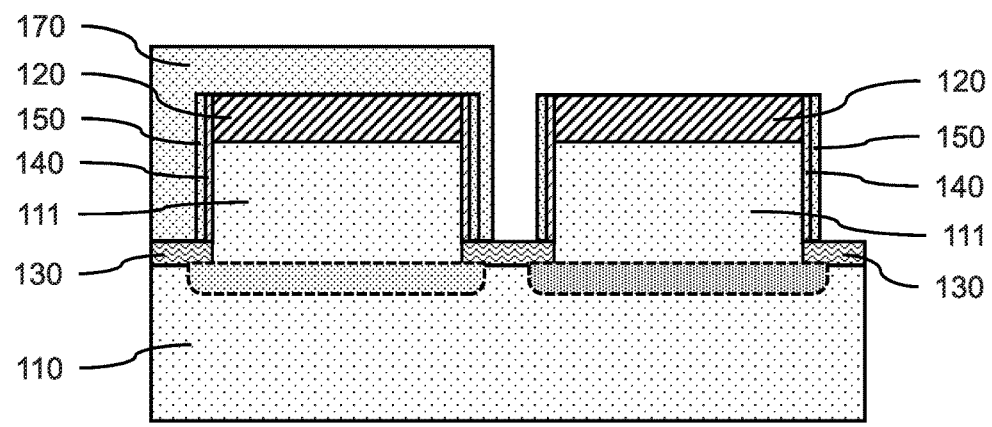
FIG. 7 is a cross-sectional side view showing the long axis of two adjacent vertical fins with a masking block covering the first work function layer on one of the two vertical fins, in accordance with an embodiment of the present invention.

FIG. 7 is a cross-sectional side view showing the long axis of two adjacent vertical fins with a masking block covering the first work function layer on one of the two vertical fins, in accordance with an embodiment of the present invention.

In one or more embodiments, a masking block 170 can be formed on one of the vertical fins 111, where the masking block can cover a portion of the first work function layer 150 on one of the two vertical fins. The masking block 170 can leave a portion of the bottom spacer layer between adjacent vertical fins 111 exposed. The placement of the masking block may not be critical for defining an edge of the first work function layer 150.

In various embodiments, the masking block 170 can be an organic planarization layer (OPL), a soft mask material, for example, a lithography resist material, such as a polymeric material (e.g. poly(methyl methacrylate) (PMMA), siloxanes, polydimethylsiloxane (PDMS), hydrogen silsesquioxane (HSQ), tetraethyl orthosilicate (TEOS), etc.) or amorphous carbon (a-C).

Figure 8:
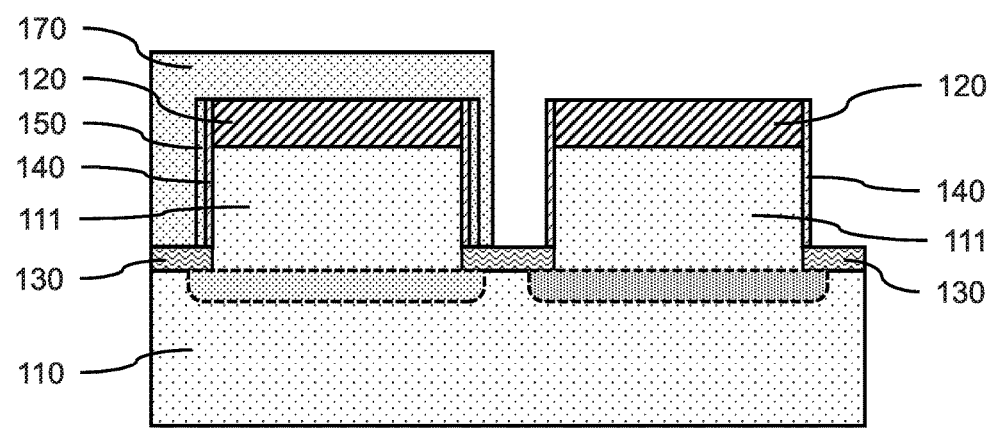
FIG. 8 is a cross-sectional side view showing the long axis of two adjacent vertical fins after removing the exposed portion of the first work function layer on the other of the two vertical fins, in accordance with an embodiment of the present invention.

FIG. 8 is a cross-sectional side view showing the long axis of two adjacent vertical fins after removing the exposed portion of the first work function layer on the other of the two vertical fins, in accordance with an embodiment of the present invention.

In one or more embodiments, the exposed portion of the first work function layer 150 on the other of the two vertical fins 111 can be removed using a selective isotropic etch. The underlying gate dielectric layer 140 can be exposed by removal of the first work function layer 150.

In various embodiments, the masking block 170 can be removed using a selective etch or ashing after exposing the gate dielectric layer 140 on the second vertical fin 111.

Figure 9:
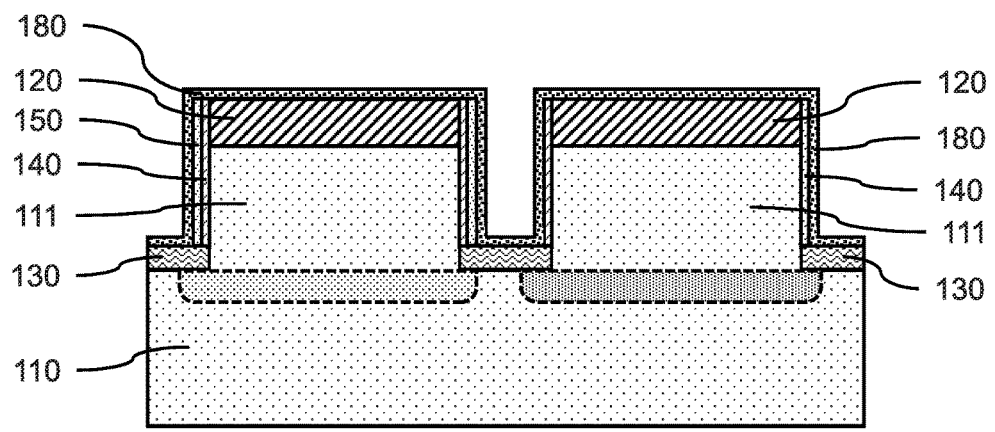
FIG. 9 is a cross-sectional side view showing the long axis of two adjacent vertical fins with a second work function layer on a portion of the first work function layer and a portion of the gate dielectric layer, in accordance with an embodiment of the present invention.

FIG. 9 is a cross-sectional side view showing the long axis of two adjacent vertical fins with a second work function layer on a portion of the first work function layer and a portion of the gate dielectric layer, in accordance with an embodiment of the present invention.

In one or more embodiments, a work function material (WFM) can form a second work function layer 180 on the exposed portion of the gate dielectric layer 140 and the exposed portion of the first work function layer 150, where the second work function layer 180 and gate dielectric layer 140 can form a gate structure on the second vertical fin 111. The second work function layer 180 can be deposited by a conformal deposition (e.g., ALD, PEALD). The second work function layer 180 can cover the first work function layer 150 and fin template 120 on the first vertical fin. The second work function layer 180 can cover a portion of the bottom spacer layer 130 between adjacent vertical fins 111, where the second work function layer 180 can be in physical and electrical contact with the first work function layer 150. The interfacial area between the second work function layer 180 and first work function layer 150 can affect the contact resistance between the gate structures on each of the vertical fins 111.

In various embodiments, the second work function layer 180 can include, but not necessarily be limited to, titanium nitride (TiN), tantalum nitride (TaN) or ruthenium (Ru), for a PFET. The second work function layer 180 can include, but not necessarily be limited to, titanium nitride (TiN), titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN or TaN, for an NFET. In various embodiments, the material of the second work function layer 180 is different from the material of the first work function layer 150. The second work function layer 180 can be a p-type work function material for forming a PFET and the first work function layer 150 can be an n-type work function material for forming an NFET.

The second work function layer 180 can have a thickness in the range of about 2 nm to about 20 nm, or about 2 nm to about 15 nm, or about 5 nm to about 15 nm, or about 5 nm to about 10 nm, although other thicknesses are contemplated.

Figure 10:
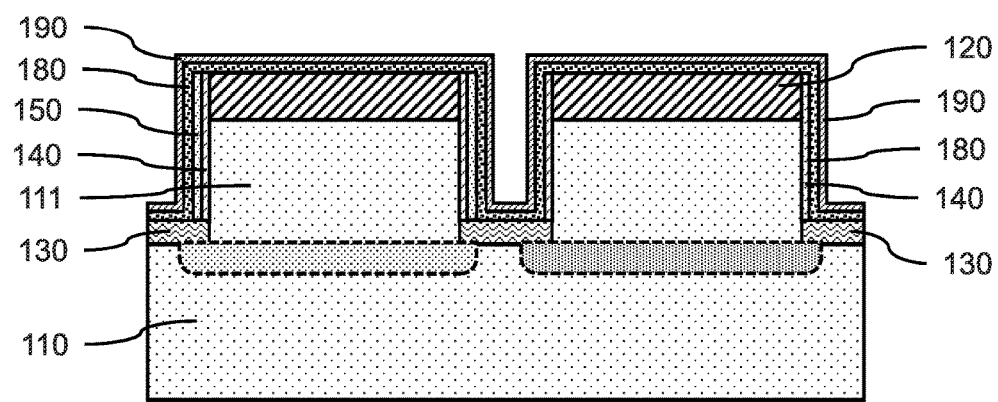
FIG. 10 is a cross-sectional side view showing the long axis of two adjacent vertical fins with a second protective liner on the second work function layer, in accordance with an embodiment of the present invention.

FIG. 10 is a cross-sectional side view showing the long axis of two adjacent vertical fins with a second protective liner on the second work function layer, in accordance with an embodiment of the present invention.

In one or more embodiments, a second protective liner 190 can be formed on the first work function layer 150 and second work function layer 180 over the vertical fins 111 and the fin templates 120, where the second protective liner 190 can cover the first work function layer 150 and second work function layer 180 on the sidewalls and endwalls of each vertical fin. The second protective liner 190 can be formed by a conformal deposition (e.g., atomic layer deposition (ALD), plasma enhanced ALD (PEALD)).

In one or more embodiments, the second protective liner 190 can be dielectric material including, but not limited to, silicon nitride (SiN), silicon oxide (SiO), a silicon oxynitride (SiON), a silicon carbide (SiC), a silicon oxygen carbonitride (SiOCN), or a silicoboron carbonitride (SiBCN), high-k dielectric materials, and a combination thereof.

In various embodiments, the second protective liner 190 can have a thickness in the range of about 1 nm to about 6 nm, or about 2 nm to about 5 nm, although other thicknesses are contemplated. The second protective liner 190 can act as an etch stop layer for removing portions of the first work function layer 150 and second work function layer 180, where the second protective liner 190 can be a material different from the fin templates 120 and bottom spacer layer 130.

The second protective liner 190 can cover a portion of the second work function layer 180 and bottom spacer layer 130 between adjacent vertical fins 111. The second work function layer 180 can form a U-shaped trough between the two vertical fins 111.

Figure 11:
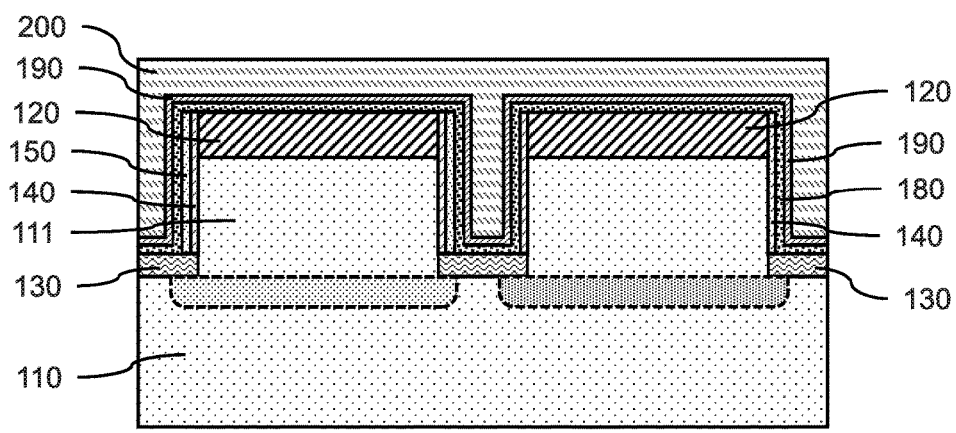
FIG. 11 is a cross-sectional side view showing the long axis of two adjacent vertical fins with a gate pattern layer on the second protective liner and second work function layer, in accordance with an embodiment of the present invention.

FIG. 11 is a cross-sectional side view showing the long axis of two adjacent vertical fins with a gate pattern layer on the second protective liner and second work function layer, in accordance with an embodiment of the present invention.

In one or more embodiments, a gate pattern layer 200 can be formed on the second protective liner 190 and second work function layer 180, where the gate pattern layer 200 can be formed by a blanket deposition (e.g., spin-on, chemical vapor deposition (CVD), etc.).

In various embodiments, the gate pattern layer 200 can be an organic planarization layer (OPL), a soft mask material, for example, a lithography resist material, such as a polymeric material (e.g. poly(methyl methacrylate) (PMMA), siloxanes, polydimethylsiloxane (PDMS), hydrogen silsesquioxane (HSQ), tetraethyl orthosilicate (TEOS), etc.) or amorphous carbon (a-C), or a hard mask comprising a dielectric material such as silicon nitride (SiN), silicon oxide (SiO), a silicon oxynitride (SiON), a silicon carbide (SiC), a silicon oxygen carbonitride (SiOCN), or a silicoboron carbonitride (SiBCN). The material of the gate pattern layer 200 can be different than the second protective liner 190, so the gate pattern layer 200 and second protective liner 190 can be selectively removed (e.g., by RIE).

Figure 12:
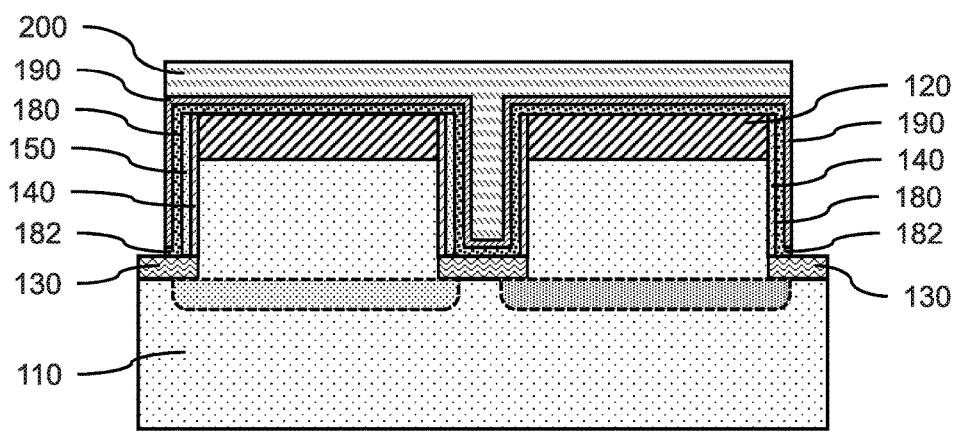
FIG. 12 is a cross-sectional side view showing the long axis of two adjacent vertical fins with a portion of the gate pattern layer covering the second work function layer between the two adjacent vertical fins, in accordance with an embodiment of the present invention.

FIG. 12 is a cross-sectional side view showing the long axis of two adjacent vertical fins with a portion of the gate pattern layer covering the second work function layer between the two adjacent vertical fins, in accordance with an embodiment of the present invention.

In one or more embodiments, a portion of the gate pattern layer 200 can be removed through masking and etching to expose portions of the underlying second protective liner 190 on the bottom spacer layer 130 that extends away from the vertical fins 111. The exposed portion of the second protective liner 190 can be removed to expose the underlying portion of the second work function layer 180. The exposed portion of the second work function layer 180 can be removed to trim the conductive work function material between predetermined gate structures. The edge of the gate pattern layer 200 may be aligned with the vertical surface of the second protective liner to trim the second work function layer 180 as closely to the vertical fins as possible. A lip 182 of the second work function layer 180 may remain on the bottom spacer layer 130.

In various embodiments, the gate pattern layer 200 can form a plug in the gap between two adjacent vertical fins 111 that masks the second protective liner 190 and second work function layer 180.

Figure 13:
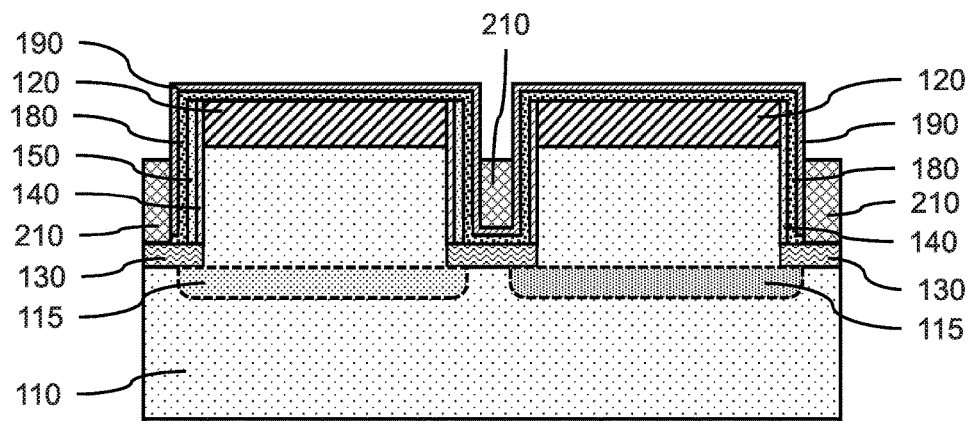
FIG. 13 is a cross-sectional side view showing the long axis of two adjacent vertical fins with a gauge layer on a lower portion of the second protective liner and second work function layer, in accordance with an embodiment of the present invention.

FIG. 13 is a cross-sectional side view showing the long axis of two adjacent vertical fins with a gauge layer on a lower portion of the second protective liner and second work function layer, in accordance with an embodiment of the present invention.

In one or more embodiments, the gate pattern layer 200 can be removed to expose the remaining portion of the second protective liner 190, where the gate pattern layer 200 can be removed using a selective, isotropic etch (e.g. wet etch) after trimming the second work function layer 180.

In one or more embodiments, a gauge layer 210 can be formed on the bottom spacer layer 130, where the gauge layer 210 can be formed by a directional deposition (e.g., GCIB) to a predetermined height, or a blanket deposition (e.g., spin-on coating, CVD) and etched back (e.g., CMP, RIE, wet etch) to a predetermined height on the sidewalls of the vertical fins 111. The recessed height of the gauge layer 210 can determine the height of the first work function layer 150 and second work function layer 180 on the vertical fins 111 to establish a gate length on the vertical fins 111. The gauge layer 210 can be a soft mask, a flowable oxide (e.g., TEOS, organic planarization layer material), a hard mask (e.g., SiO$_2$), or a combination thereof, where the gauge layer 210 can be selectively etched relative to the surrounding materials.

In one or more embodiments, the gate structures can have an actual gate length in a range of about 5 nm to about 40 nm, or about 8 nm to about 30 nm, or about 10 nm to about 20 nm, on the vertical fins 111, although other gate lengths are contemplated.

Figure 14:
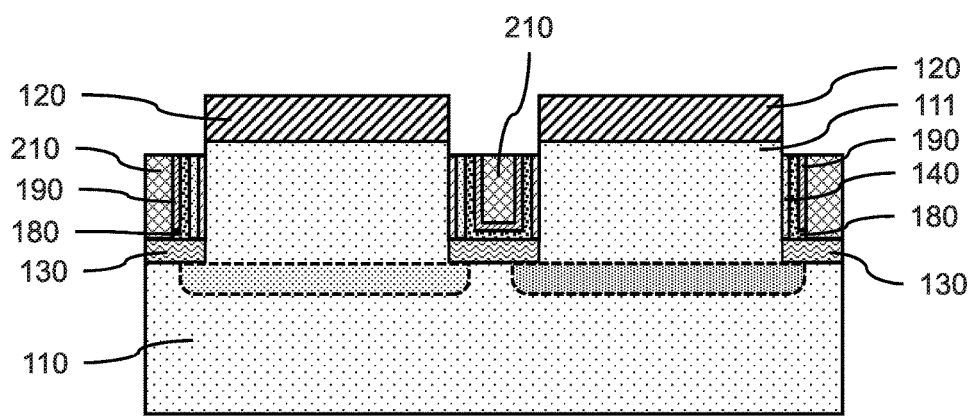
FIG. 14 is a cross-sectional side view showing the long axis of two adjacent vertical fins with an exposed portion of the second work function layer, first work function layer, and gate dielectric layer removed to form a gate structure, in accordance with an embodiment of the present invention.

FIG. 14 is a cross-sectional side view showing the long axis of two adjacent vertical fins with an exposed portion of the second work function layer, first work function layer, and gate dielectric layer removed to form a gate structure, in accordance with an embodiment of the present invention.

In one or more embodiments, portions of the second protective liner 190, first work function layer 150, second work function layer 180, and gate dielectric layer 140 exposed by recessing the gauge layer 210 can be removed by one or more selective etchings. Removing portions of the second protective liner 190, first work function layer 150, second work function layer 180, and gate dielectric layer 140 extending above the gauge layer 210 can expose the fin templates 120 and an upper portion of each vertical fin 111.

Figure 15:
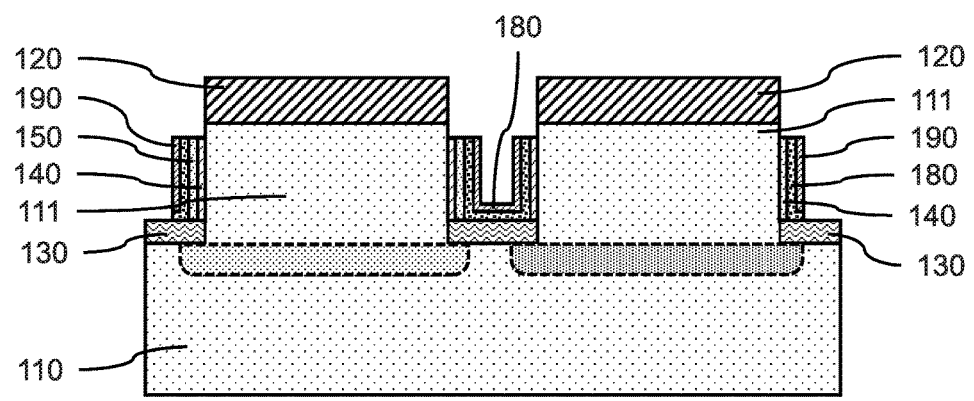
FIG. 15 is a cross-sectional side view showing the long axis of two adjacent vertical fins with the gauge layer removed, in accordance with an embodiment of the present invention.

FIG. 15 is a cross-sectional side view showing the long axis of two adjacent vertical fins with the gauge layer removed, in accordance with an embodiment of the present invention.

In one or more embodiments, the gauge layer 210 can be removed using a selective etch to expose the second protective liner 190 and portions of the bottom spacer layer 130. The second work function layer 180 can form a portion of the gate structure on one vertical fin 111 and a U-shaped electrical connection to the first work function layer 150 on the other vertical fin 111. A remaining portion of the second protective liner 190 can remain on the vertical surfaces of the second work function layer 180.

Figure 16:
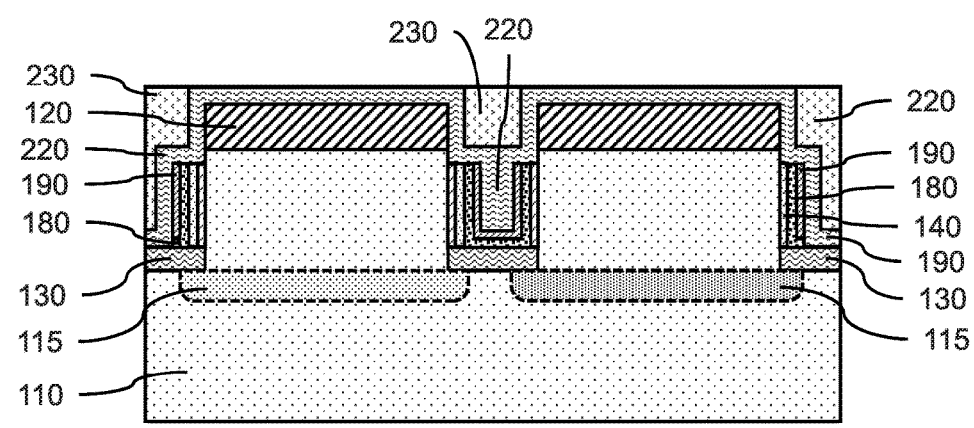
FIG. 16 is a cross-sectional side view showing the long axis of two adjacent vertical fins with a top spacer layer and an interlayer dielectric (ILD) layer on the gate structure, in accordance with an embodiment of the present invention.

FIG. 16 is a cross-sectional side view showing the long axis of two adjacent vertical fins with a top spacer layer and an interlayer dielectric (ILD) layer on the gate structure, in accordance with an embodiment of the present invention.

In one or more embodiments, a top spacer layer 220 can be formed on the second protective liner 190 and gate structures, including the first work function layer 150 and/or second work function layer 180, and gate dielectric layer 140, on each of the vertical fins 111. The top spacer layer 220 can be formed by a conformal deposition (e.g., ALD, PEALD, CVD, PECVD) to cover the horizontal and vertical surfaces of the second protective liner 190, fin templates 120, and vertical fins 111.

In various embodiments, the material of the top spacer layer 220 can be a dielectric material, including, but not be limited to, silicon oxide (SiO), silicon nitride (SiN), a silicon oxynitride (SiON), a silicon carbonitride (SiCN), a silicon boronitride (SiBN), a silicon borocarbide (SiBC), a low-K dielectric, or combinations thereof.

In one or more embodiments an interlayer dielectric (ILD) layer 230 can be formed on the top spacer layer 220, where the ILD layer 230 can be formed by a blanket deposition and a chemical-mechanical polishing (CMP) to remove excess material. The ILD layer can be a dielectric material (e.g., SiO, SiO:C, etc.).

In various embodiments, excess material of the interlayer dielectric (ILD) layer 230 extending above the top spacer layer 220 and/or fin templates 120 can be removed and planarized using CMP. The height of the ILD layer 230 can be reduced to expose the top spacer layer 220 and/or fin templates 120.

In various embodiments, the exposed fin templates 120 can be removed using a selective etch to expose the underlying surface of the vertical fins 111. A top source/drain can be formed on the exposed surfaces of the vertical fins 111 by epitaxial growth.

In a non-limiting exemplary embodiments, the first work function layer 150 can be a p-type work function material to fabricate a p-type FinFET from one of the vertical fins 111, and the second work function layer 180 can be an n-type work function material to fabricate an n-type FinFET from the adjacent vertical fin. The gate dielectric layer 140 can be a high-K insulating dielectric material. Top and bottom source/drains can be suitably doped to form the N and P FETs.

Figure 17:
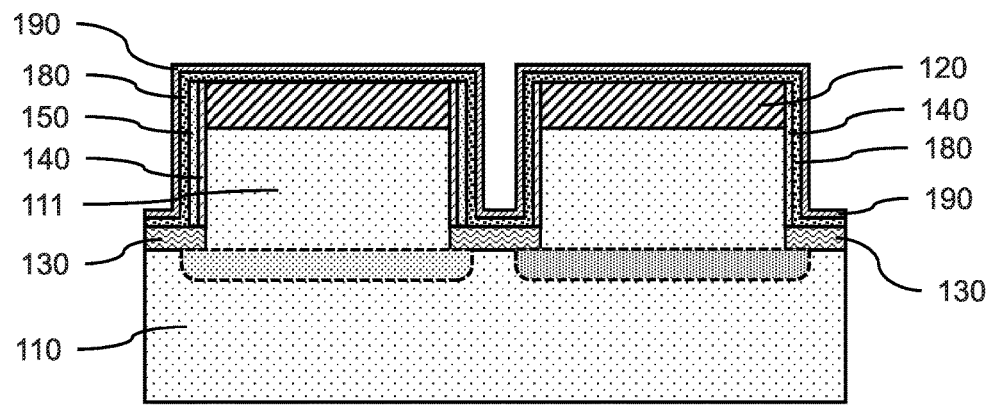
FIG. 17 is a cross-sectional side view showing the long axis of two adjacent vertical fins, as shown in FIG. 10, with a second protective liner on the second work function layer, in accordance with another embodiment of the present invention.

FIG. 17 is a cross-sectional side view showing the long axis of two adjacent vertical fins, as shown in FIG. 10, with a second protective liner on the second work function layer, in accordance with another embodiment of the present invention.

A second protective liner 190 can be on the first work function layer 150 and second work function layer 180 over the vertical fins 111 and the fin templates 120, where the second protective liner 190 can cover the first work function layer 150 and second work function layer 180 on the sidewalls and endwalls of each vertical fin.

Figure 18:
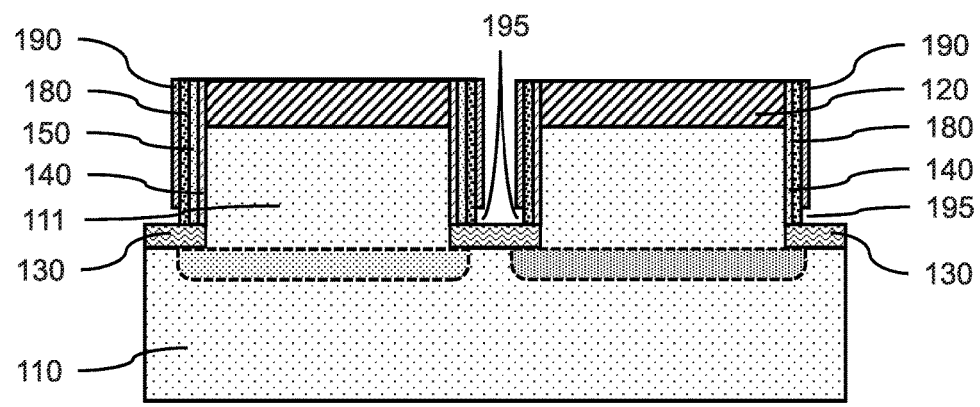
FIG. 18 is a cross-sectional side view showing the long axis of two adjacent vertical fins after removing the protective liner and second work function layer from a portion of the horizontal surfaces, in accordance with another embodiment of the present invention.

FIG. 18 is a cross-sectional side view showing the long axis of two adjacent vertical fins after removing the protective liner and second work function layer from a portion of the horizontal surfaces, in accordance with another embodiment of the present invention.

In one or more embodiments, a portion of the second protective liner 190 can be removed using a selective directional etch (e.g., RIE) to expose the underlying second work function layer 180 on the horizontal surfaces. An isotropic etch can be used to remove the exposed portions of the second work function layer 180, which can form undercut regions 195 below the portions of the second protective liner 190 remaining on the vertical sidewalls and endwalls. In various embodiments, the first work function layer 150 can be removed from between the two adjacent vertical fins 111 using an isotropic etch.

Figure 19:
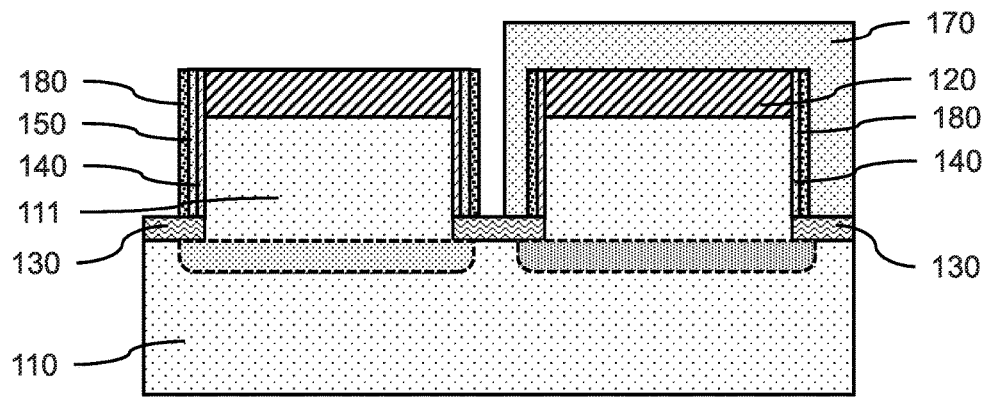
FIG. 19 is a cross-sectional side view showing the long axis of two adjacent vertical fins with a masking block covering the second work function layer on one of the two vertical fins, in accordance with another embodiment of the present invention.

FIG. 19 is a cross-sectional side view showing the long axis of two adjacent vertical fins with a masking block covering the second work function layer on one of the two vertical fins, in accordance with another embodiment of the present invention.

In one or more embodiments, the remaining portion of the second protective liner 190 can be removed using a selective, isotropic etch, where removal of the second protective liner can eliminate the undercut region and expose the second work function layer 180.

In one or more embodiments, a masking block 170 can be formed on one of the vertical fins 111, where the masking block can cover a portion of the second work function layer 180 on one of the two vertical fins 111.

Figure 20:
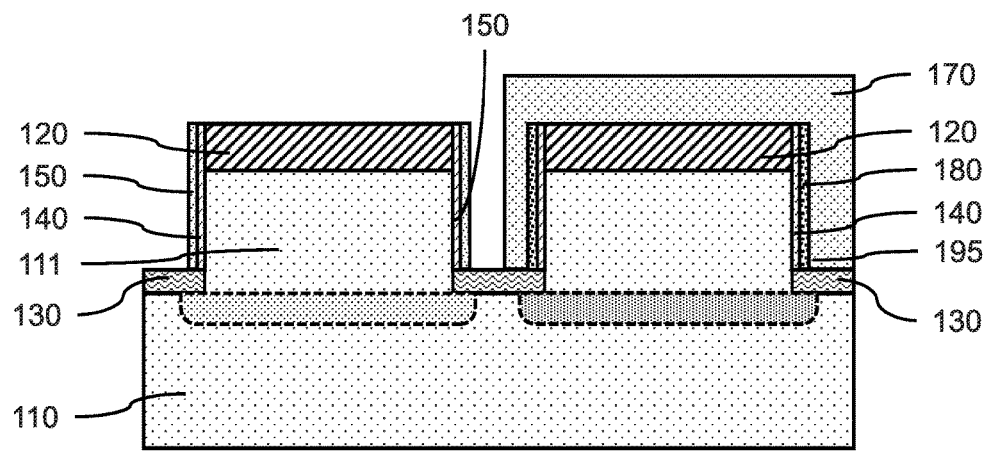
FIG. 20 is a cross-sectional side view showing the long axis of two adjacent vertical fins after removing the second work function layer from the exposed vertical fin, in accordance with another embodiment of the present invention.

FIG. 20 is a cross-sectional side view showing the long axis of two adjacent vertical fins after removing the second work function layer from the exposed vertical fin, in accordance with another embodiment of the present invention.

In one or more embodiments, the exposed second work function layer 180 can be removed from the other vertical fin not covered by the masking block 170, where the second work function layer 180 can be removed using a selective etch. Removal of the exposed second work function layer 180 can form a gap between the two adjacent vertical fins 111, such that the first and second work functions layers do not overlap. The second work function layer 180 can form part of the gate structure on one vertical fin and the first work function layer 150 separately can form part of the gate structure on the other vertical fin.

Figure 21:
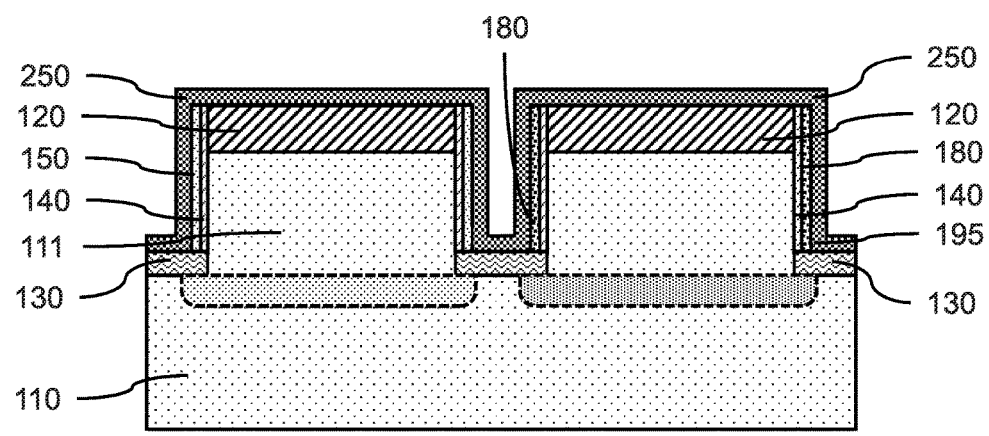
FIG. 21 is a cross-sectional side view showing the long axis of two adjacent vertical fins with a conductive gate layer formed on the exposed portions of the first work function layer and second work function layer, in accordance with another embodiment of the present invention.

FIG. 21 is a cross-sectional side view showing the long axis of two adjacent vertical fins with a conductive gate layer formed on the exposed portions of the first work function layer and second work function layer, in accordance with another embodiment of the present invention.

In one or more embodiments, a conductive gate layer 250 can be formed on the exposed portions of the first work function layer 150 and second work function layer 180 to form an electrical connection between the two separate gate structures. The conductive gate layer 250 can be formed by a conformal deposition (e.g., ALD, PEALD, CVD, PECVD), where the conductive gate layer 250 can be formed on the bottom spacer layer 130, first work function layer 150 and second work function layer 180. Since the work function layers do not overlap, the conductive gate layer 250 can electrically couple the first work function layer 150 to the second work function layer 180.

In various embodiments, the conductive gate layer 250 can be tungsten (W), tantalum (Ta), tantalum nitride (TaN), titanium nitride (TiN), titanium carbide (TiC), or a combination thereof.

In various embodiments, the conductive gate layer 250 can have a thickness in the range of about 2 nm to about 20 nm, or in the range of about 3 nm to about 10 nm, or about 4 nm to about 8 nm, although other thicknesses are contemplated.

Figure 22:
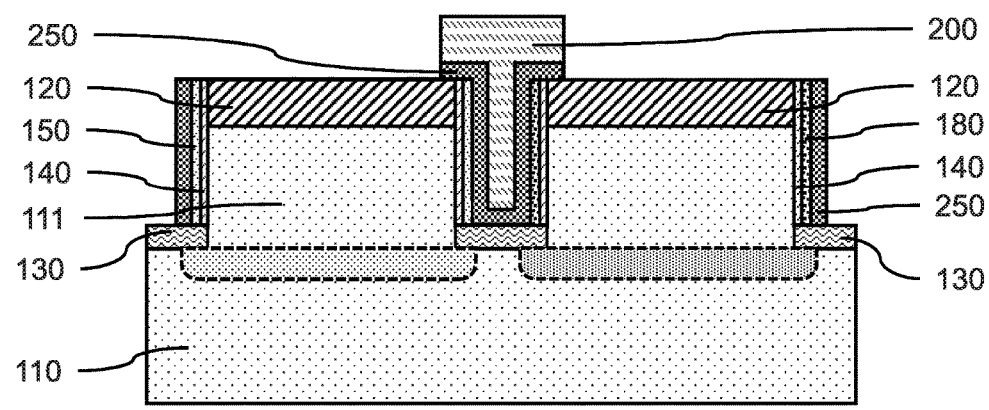
FIG. 22 is a cross-sectional side view showing the long axis of two adjacent vertical fins with a gate pattern layer covering the conductive gate layer between the two adjacent vertical fins, in accordance with an embodiment of the present invention.

FIG. 22 is a cross-sectional side view showing the long axis of two adjacent vertical fins with a gate pattern layer covering the conductive gate layer between the two adjacent vertical fins, in accordance with an embodiment of the present invention.

In one or more embodiments, a gate pattern layer 200 can be formed on the conductive gate layer 250, where the gate pattern layer 200 can be formed by a blanket deposition (e.g., spin-on, chemical vapor deposition (CVD), etc.). The gate pattern layer 200 can be patterned by masking and etching to expose portions of the underlying conductive gate layer 250 on the fin templates 120 and bottom spacer layer extending away from the adjacent vertical fins 111. The gate pattern layer can plug the gap between two adjacent vertical fins and mask the conductive gate layer 250 to preserve a U-shaped electrical connection, while other portions of the conductive gate layer 250 can be trimmed. The work function layers can be limited to the sidewalls and endwalls of the vertical fins forming the FinFETs, and the conductive gate layer 250 can be in physical and electrical contact with the work function layers 180, 150 on the adjacent vertical fins.

Figure 23:
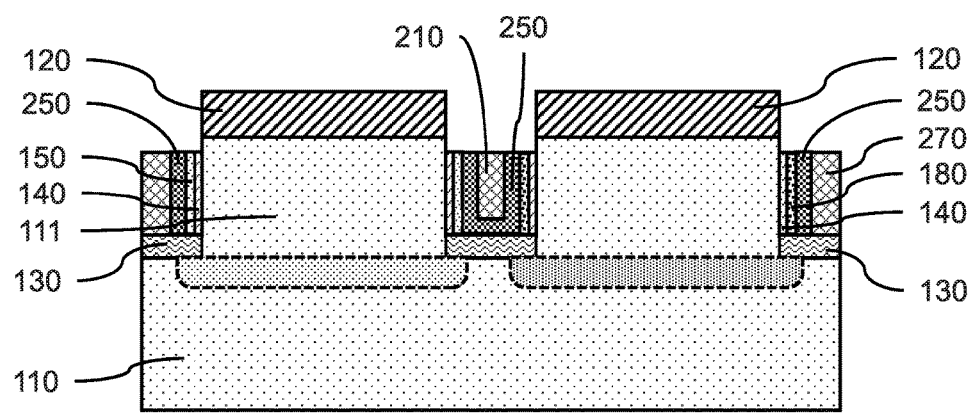
FIG. 23 is a cross-sectional side view showing the long axis of two adjacent vertical fins with a gauge layer on a lower portion of the conductive gate layer and work function layers, in accordance with an embodiment of the present invention.

FIG. 23 is a cross-sectional side view showing the long axis of two adjacent vertical fins with a gauge layer on a lower portion of the conductive gate layer and work function layers, in accordance with an embodiment of the present invention.

In one or more embodiments, a gauge layer 210 can be formed on the bottom spacer layer 130, where the gauge layer 210 can be formed by a blanket deposition and etched back to a predetermined height on the sidewalls of the vertical fins 111. The recessed height of the gauge layer 210 can determine the height of the first work function layer 150 and second work function layer 180 on the vertical fins 111 to establish a gate length. The gauge layer 210 can be a soft mask or hard mask.

In one or more embodiments, portions of the conductive gate layer 250, first work function layer 150, second work function layer 180, and gate dielectric layer 140 exposed by recessing the gauge layer 210 can be removed by one or more selective etchings. Removing portions of the conductive gate layer 250, first work function layer 150, second work function layer 180, and gate dielectric layer 140 can expose the fin templates 120 and an upper portion of each vertical fin 111.

The conductive gate layer 250 can form a part of each gate structure on each vertical fin 111 and a U-shaped electrical connection between the second work function layer 180 and the first work function layer 150 of the separate gate structures.

Figure 24:
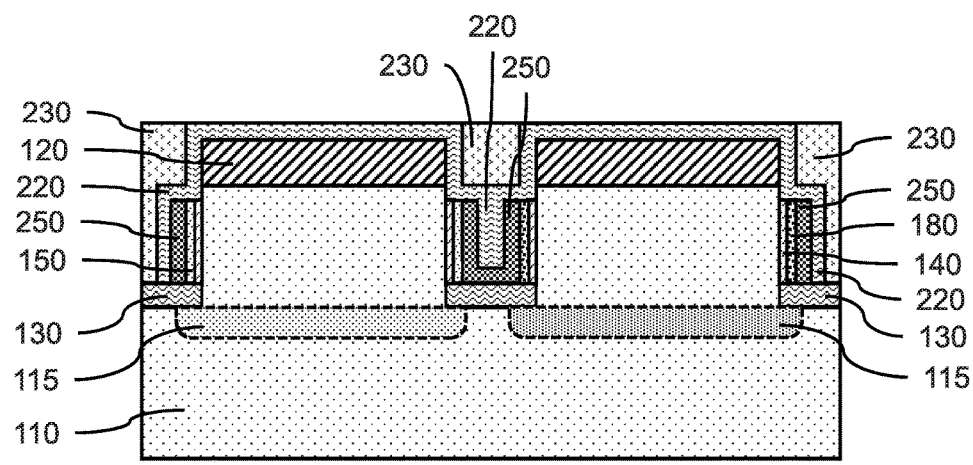
FIG. 24 is a cross-sectional side view showing the long axis of two adjacent vertical fins with a top spacer layer and an interlayer dielectric (ILD) layer on the gate structure, in accordance with an embodiment of the present invention.

FIG. 24 is a cross-sectional side view showing the long axis of two adjacent vertical fins with a top spacer layer and an interlayer dielectric (ILD) layer on the gate structure, in accordance with an embodiment of the present invention.

In one or more embodiments, a top spacer layer 220 can be formed on the conductive gate layer 250 and gate structures, including the first work function layer 150 or second work function layer 180, and gate dielectric layer 140, on each of the vertical fins 111. The top spacer layer 220 can be formed by a conformal deposition (e.g., ALD, PEALD, CVD, PECVD) to cover the horizontal and vertical surfaces.

In one or more embodiments an interlayer dielectric (ILD) layer 230 can be formed on the top spacer layer 220, where the ILD layer 230 can be formed by a blanket deposition and a chemical-mechanical polishing (CMP) to remove excess material. The ILD layer can be a dielectric material (e.g., SiO, SiO:C, etc.).

In various embodiments, a top source/drain can be formed by removing a portion of the top spacer layer 220 and fin templates 120, and forming the top source/drain on the exposed surface of each of the vertical fins 111. The top source/drains can be formed of silicon or silicon-germanium and suitably doped to form n-type or p-type FinFETs. Bottom source/drain regions 115 can be formed by implanting a suitable dopant into the substrate 110 below each of the vertical fins 111.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a device and fabrication method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a complementary metal-oxide-semiconductor (CMOS) device, comprising:
 forming a bottom spacer layer on a substrate around two adjacent vertical fins;
 forming a first work function layer on both of the two adjacent vertical fins;
 removing a portion of the first work function layer from one of the two adjacent vertical fins; and forming a second work function layer on the remaining portion of the first work function layer and on the one of the two adjacent vertical fins, wherein the second work function layer forms part of a gate structure on the one of the two adjacent vertical fins and an electrical connection to the first work function layer on the other of the two adjacent vertical fins.

2. The method of claim 1, further comprising, forming a gauge layer on the second work function layer on both of the two adjacent vertical fins, and removing a portion of the first work function layer and second work function layer extending above the gauge layer.

3. The method of claim 2, further comprising, forming a top spacer layer on at least a portion of the first work function layer and a portion of the second work function layer.

4. The method of claim 1, wherein the first work function layer is made of an n-type work function material, and the second work function layer is made of a p-type work function material.

5. The method of claim 4, wherein the first work function layer has a thickness in a range of about 5 nm to about 20 nm, and the second work function layer has a thickness in a range of about 5 nm to about 20 nm.

6. The method of claim 1, further comprising, forming a gate dielectric layer on both of the two adjacent vertical fins, wherein the gate dielectric layer is between the first work function layer and the other of the two adjacent vertical fins.

7. The method of claim 6, further comprising, forming a gate pattern layer on the second work function layer between the two adjacent vertical fins, and removing a portion of the second work function layer on the bottom spacer layer not covered by the gate pattern layer.

8. The method of claim 7, wherein a first gate structure on the one of the two vertical fins includes the gate dielectric layer and the portion of the second work function layer, and a second gate structure includes the gate dielectric layer, the remaining portion of the first work function layer, and the portion of the second work function layer on the first work function layer.

9. The method of claim 8, wherein the first work function layer is a material selected from the group consisting of titanium nitride (TiN), tantalum nitride (TaN), and ruthenium (Ru).

10. A method of forming a complementary metal-oxide-semiconductor (CMOS) device, comprising:
    forming a bottom spacer layer on a substrate around two adjacent vertical fins;
    forming a first work function layer on both of the two adjacent vertical fins;
    removing a portion of the first work function layer from one of the two adjacent vertical fins;
    forming a second work function layer on the remaining portion of the first work function layer and on the one of the two adjacent vertical fins, wherein the second work function layer forms part of a gate structure on the one of the two adjacent vertical fins; and
    removing the second work function layer from the remaining portion of the first work function layer.

11. The method of claim 10, further comprising, forming a conductive gate layer on the first work function layer and the second work function layer, wherein the conductive gate layer forms an electrical connection between the first work function layer and the second work function layer.

12. The method of claim 10, further comprising, removing a portion of the conductive gate layer from a portion of the bottom spacer layer and a portion of each of the two vertical fins.

13. The method of claim 12, further comprising, forming a gauge layer on the first work function layer and the second work function layer, and removing a portion of the conductive gate layer on the first work function layer and the second work function layer extending above the gauge layer.

14. The method of claim 13, wherein the conductive gate layer forms a U-shaped electrical connection between the first work function layer and the second work function layer.

15. A complementary metal-oxide-semiconductor (CMOS) device, comprising:
    a bottom spacer layer on a substrate around two adjacent vertical fins;
    a first work function layer on one of the two adjacent vertical fins; and
    a second work function layer on the first work function layer and the other of the two adjacent vertical fins, wherein the second work function layer forms part of a gate structure on the other of the two adjacent vertical fins and an electrical connection to the first work function layer.

16. The device of claim 15, further comprising, a gate dielectric layer on both of the two adjacent vertical fins, wherein the gate dielectric layer is between the first work function layer and the one of the two adjacent vertical fins, and between the second work function layer and the other of the two adjacent vertical fins.

17. The device of claim 16, wherein the first work function layer is made of an n-type work function material, and the second work function layer is made of a p-type work function material.

18. The device of claim 17, wherein the second work function layer is a material selected from the group consisting of titanium nitride (TiN), titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN), lanthanum (La) doped TiN, and lanthanum (La) doped tantalum nitride (TaN).

19. The device of claim 17, wherein the first work function layer has a thickness in a range of about 2 nm to about 20 nm, and the second work function layer has a thickness in a range of about 5 nm to about 20 nm.

20. The device of claim 17, wherein the second work function layer forms an integral u-shaped electrical gate connection to the first work function layer.

* * * * *